US012736575B2

(12) United States Patent
Wang et al.

(10) Patent No.: US 12,736,575 B2
(45) Date of Patent: Sep. 15, 2026

(54) INTERNAL SHORT CIRCUIT PREDICTION GENERATION

(71) Applicant: GM GLOBAL TECHNOLOGY OPERATIONS LLC, Detroit, MI (US)

(72) Inventors: Yue-Yun Wang, Troy, MI (US); Xiumei Guo, Troy, MI (US); Andrew C. Baughman, Northville, MI (US); Bryan Paul Jagielo, Linden, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 392 days.

(21) Appl. No.: 18/360,179

(22) Filed: Jul. 27, 2023

(65) Prior Publication Data

US 2025/0035692 A1 Jan. 30, 2025

(51) Int. Cl.
*G01R 31/00* (2006.01)
*G01R 31/36* (2020.01)
(Continued)

(52) U.S. Cl.
CPC ....... *G01R 31/007* (2013.01); *G01R 31/3648* (2013.01); *G01R 31/392* (2019.01);
(Continued)

(58) Field of Classification Search
CPC .. G01R 31/007; G01R 31/392; G01R 31/396; G01R 31/3648; H01M 10/482; H01M 10/486
(Continued)

(56) References Cited

U.S. PATENT DOCUMENTS 11,686,778 B1 * 6/2023 Wu ...................... G01R 31/392 324/432
2022/0352737 A1 * 11/2022 Wang .................. G01R 31/396
(Continued)

FOREIGN PATENT DOCUMENTS

| | | | |
|---|---|---|---|
| CN | 114879062 | A | 8/2022 |
| DE | 102022105477 | A1 | 11/2022 |
| WO | 2023224414 | A1 | 11/2023 |

OTHER PUBLICATIONS

German Application No. 10 2023 128 159.3 filed Oct. 14, 2023; German Office Action dated Jul. 12, 2024; 9 pages.

*Primary Examiner* — Michael P Nghiem
(74) *Attorney, Agent, or Firm* — CANTOR COLBURN LLP

(57) ABSTRACT

Techniques are provided for generating an internal short circuit prediction of a battery cell. In one embodiment, the techniques involve receiving feature measurements of a plurality of cells, determining a snapshot moving average of the feature measurement of each of the plurality of cells based on a corresponding measurement window, determining a health indicator of each of the plurality of cells based on the respective snapshot moving averages, ranking a plurality of health indicators of the respective plurality of cells, wherein the plurality of health indicators is ranked by magnitude, determining a short circuit threshold value based on a second-ranked health indicator, and upon determining that a first-ranked health indicator exceeds the short circuit threshold value, generating a prediction of a short circuit in a cell corresponding to the first-ranked health indicator.

20 Claims, 4 Drawing Sheets

(51) Int. Cl.
*G01R 31/392* (2019.01)
*G01R 31/396* (2019.01)
*H01M 10/48* (2006.01)

(52) U.S. Cl.
CPC ........ *G01R 31/396* (2019.01); *H01M 10/482* (2013.01); *H01M 10/486* (2013.01)

(58) Field of Classification Search
USPC ............................................................ 702/58
See application file for complete search history.

(56) References Cited

U.S. PATENT DOCUMENTS

2023/0152388 A1 5/2023 Sung et al.
2023/0366935 A1 11/2023 Lee et al.

* cited by examiner

INTERNAL SHORT CIRCUIT PREDICTION GENERATION

INTRODUCTION

The subject disclosure relates to battery cell prognosis, and more specifically, to predicting an internal short of a battery cell.

An electric vehicle, or a hybrid electric vehicle, uses a battery pack to power the motor and auxiliary electrical systems. The battery pack includes a plurality of interconnected cells that can develop internal short circuits. An internal short can bypass or reduce a designed resistance of a cell, and cause a sudden increase in current through a shorted electrical pathway, which can cause reduced performance or failure the cell.

SUMMARY

In one exemplary embodiment, a method is provided to predict a circuit condition of a power system of a vehicle. The method includes receiving feature measurements of a plurality of cells of the power system, determining a snapshot moving average of the feature measurement of each of the plurality of cells based on a corresponding measurement window, determining a health indicator of each of the plurality of cells based on the respective snapshot moving averages, ranking a plurality of health indicators of the respective plurality of cells, wherein the plurality of health indicators is ranked by magnitude, determining a short circuit threshold value based on a second-ranked health indicator, and upon determining that a first-ranked health indicator exceeds the short circuit threshold value, generating a prediction of a short circuit in a cell corresponding to the first-ranked health indicator.

In addition to one or more of the features described herein, the feature measurements include a voltage, a current, a temperature, a pressure measurement, or a gas vent value; and wherein the health indicators include a voltage drop, an estimated internal short resistance, a solid electrolyte interface thickness, a state of charge, a cell capacity, or a lithium plating index.

In addition to one or more of the features described herein, a size of the measurement window is based on an expected short resistance of the plurality of cells.

In addition to one or more of the features described herein, a size of the measurement window is constant, wherein data of the measurement window is entered into a parallel staggered data buffer, and wherein the data buffer is processed at intervals based on an expected short resistance of the plurality of cells.

In addition to one or more of the features described herein, the feature measurements are determined during a relaxation period of the plurality of cells.

In addition to one or more of the features described herein, the feature measurements are determined from cell-balanced cells, and wherein the feature measurements are reverted to non-cell balanced values via voltage to state of charge conversions.

In addition to one or more of the features described herein, the plurality of health indicators is ranked in ascending or descending order, wherein the first-ranked health indicator indicates a potential short of a cell corresponding to the first-ranked health indicator, and wherein the second-ranked health indicator indicates an absence of a short of a cell corresponding to the second-ranked health indicator.

In another exemplary embodiment, a system is provided to predict a circuit condition of a power system of a vehicle. The system includes a processor, and memory or storage comprising an algorithm or computer instructions, which when executed by the processor, performs an operation comprising receiving feature measurements of a plurality of cells of the power system, determining a snapshot moving average of the feature measurement of each of the plurality of cells based on a corresponding measurement window, determining a health indicator of each of the plurality of cells based on the respective snapshot moving averages, ranking a plurality of health indicators of the respective plurality of cells, wherein the plurality of health indicators is ranked by magnitude, determining a short circuit threshold value based on a second-ranked health indicator, and upon determining that a first-ranked health indicator exceeds the short circuit threshold value, generating a prediction of a short circuit in a cell corresponding to the first-ranked health indicator.

In addition to one or more of the features described herein, the feature measurements include a voltage, a current, a temperature, a pressure measurement, or a gas vent value; and wherein the health indicators include a voltage drop, an estimated internal short resistance, a solid electrolyte interface thickness, a state of charge, a cell capacity, or a lithium plating index.

In addition to one or more of the features described herein, a size of the measurement window is based on an expected short resistance of the plurality of cells.

In addition to one or more of the features described herein, a size of the measurement window is constant, wherein data of the measurement window is entered into a parallel staggered data buffer, and wherein the data buffer is processed at intervals based on an expected short resistance of the plurality of cells.

In addition to one or more of the features described herein, the feature measurements are determined during a relaxation period of the plurality of cells.

In addition to one or more of the features described herein, the feature measurements are determined from cell-balanced cells, and wherein the feature measurements are reverted to non-cell balanced values via voltage to state of charge conversions.

In addition to one or more of the features described herein, the plurality of health indicators is ranked in ascending or descending order, wherein the first-ranked health indicator indicates a potential short of a cell corresponding to the first-ranked health indicator, and wherein the second-ranked health indicator indicates an absence of a short of a cell corresponding to the second-ranked health indicator.

In yet another exemplary embodiment, a computer-readable storage medium having a computer-readable program code embodied therewith is provided to predict a circuit condition of a power system of a vehicle. The computer-readable program code is executable by one or more computer processors to perform an operation comprising receiving feature measurements of a plurality of cells of the power system, determining a snapshot moving average of the feature measurement of each of the plurality of cells based on a corresponding measurement window, determining a health indicator of each of the plurality of cells based on the respective snapshot moving averages, ranking a plurality of health indicators of the respective plurality of cells, wherein the plurality of health indicators is ranked by magnitude, determining a short circuit threshold value based on a second-ranked health indicator, and upon determining that a first-ranked health indicator exceeds the short circuit threshold value, generating a prediction of a short circuit in a cell corresponding to the first-ranked health indicator.

In addition to one or more of the features described herein, the feature measurements include a voltage, a current, a temperature, a pressure measurement, or a gas vent value; and wherein the health indicators include a voltage drop, an estimated internal short resistance, a solid electrolyte interface thickness, a state of charge, a cell capacity, or a lithium plating index.

In addition to one or more of the features described herein, a size of the measurement window is based on an expected short resistance of the plurality of cells.

In addition to one or more of the features described herein, a size of the measurement window is constant, wherein data of the measurement window is entered into a parallel staggered data buffer, and wherein the data buffer is processed at intervals based on an expected short resistance of the plurality of cells.

In addition to one or more of the features described herein, the feature measurements are determined from cell-balanced cells, and wherein the feature measurements are reverted to non-cell balanced values via voltage to state of charge conversions.

In addition to one or more of the features described herein, the plurality of health indicators is ranked in ascending or descending order, wherein the first-ranked health indicator indicates a potential short of a cell corresponding to the first-ranked health indicator, and wherein the second-ranked health indicator indicates an absence of a short of a cell corresponding to the second-ranked health indicator.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
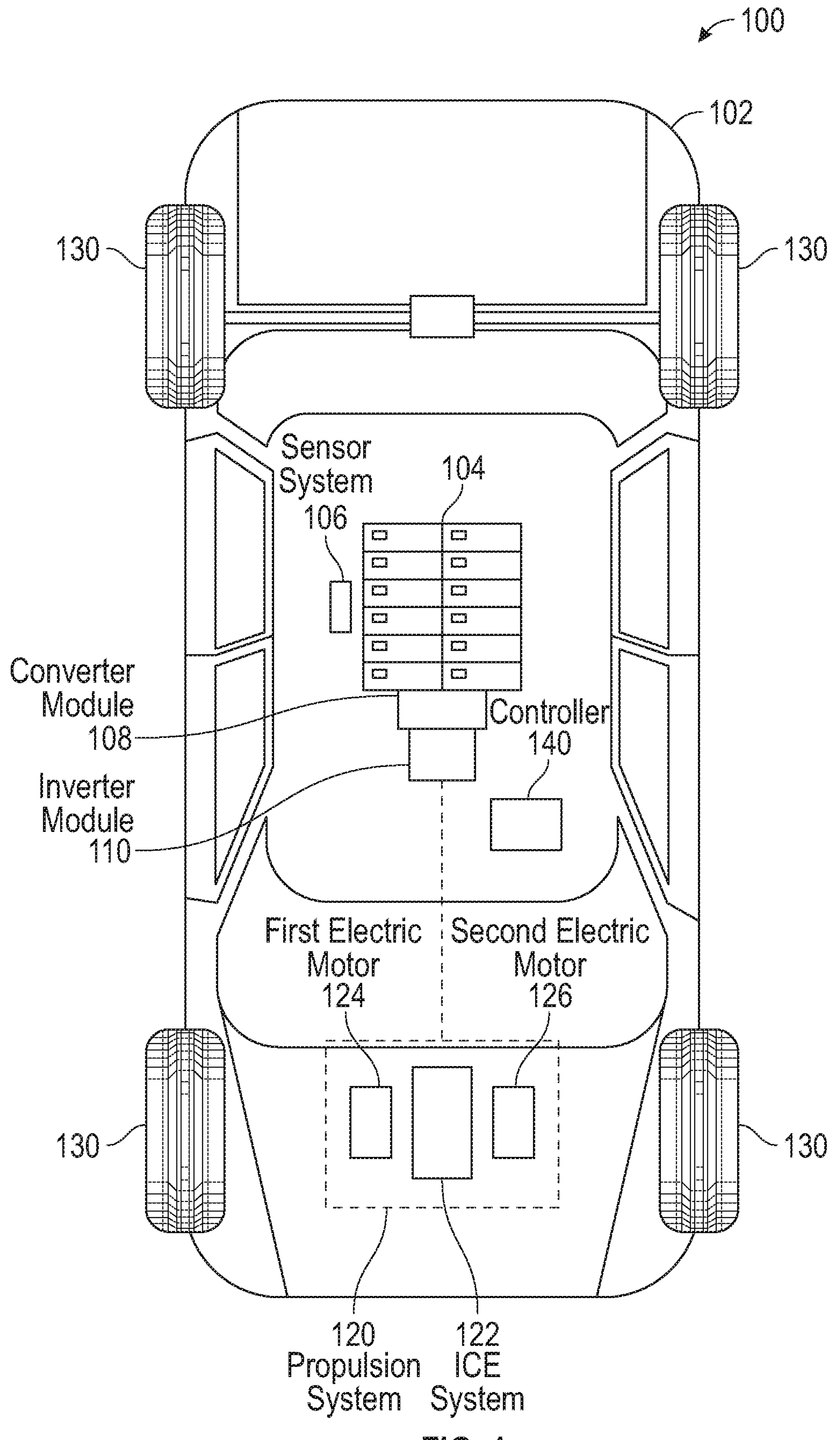
FIG. 1 illustrates a vehicle, according to an embodiment.

The following description is merely exemplary in nature and is not intended to limit the present disclosure, its application or uses. It should be understood that throughout the drawings, corresponding reference numerals indicate like or corresponding parts and features. As used herein, the term "module" can refer to one or more algorithms, instruction sets, software applications, or other computer-readable program code that can be executed by a processor to perform the functions, operations, or processes described herein.

Embodiments of the present disclosure improve upon battery systems by predicting internal short circuits in battery cells, and taking preventative actions to mitigate potential harm caused by the internal shorts. In one embodiment, a prognostic module uses a snapshot of moving averages of feature measurements (e.g., a voltage, a current, a temperature, a pressure measurement, a gas vent value, or the like) of cells to determine health indicators (e.g., a voltage drop, an estimated internal short resistance, a solid electrolyte interface (SEI) thickness, a state of charge (SOC), a cell capacity, or the like) of the cells. The prognostic module can rank the health indicators, and determine a short circuit threshold value based on the ranking. When a health indicator of a cell exceeds the short circuit threshold value, the prognostic module can predict a presence or development of a short circuit in the cell. The prognostic module can then inform a vehicle user of the short circuit, or control the operation of the vehicle to mitigate the impact of the short circuit on the cell.

One benefit of the disclosed embodiments is to improve signal to noise ratios for determining health indicators of a cell in electrically noisy environments, which can aid in diagnosing or predicting problems of the cell. Further, embodiments of the present disclosure can prevent or mitigate an impact of using a short-circuited cell, which can cause reduced performance or failure of the cells.

FIG. 1 illustrates a vehicle 100, according to an embodiment. The vehicle 100 includes a body 102, which can support a power system 104, sensor system 106, propulsion system 120, a controller 140, and other systems of the vehicle 100 described herein.

In one embodiment, the vehicle 100 is an internal combustion engine (ICE) vehicle, an electric vehicle (EV), or a hybrid electric vehicle (HEV). In the illustrated embodiment, the vehicle 100 is an HEV that is partially powered by the power system 104, which includes multiple interconnected battery cells. The power system 104 can be electrically coupled to at least one electric motor assembly of the propulsion system 120. In one embodiment, the power system 104 is electrically coupled to a direct current (DC) converter module 108 (e.g., a DC-DC converter) and an inverter module 110 (e.g., a traction power inversion unit). The inverter module 110 can include multiple inverters that convert DC signals from the power system 104 to three-phase alternating current (AC) signals to drive electric motors of the propulsion system 120. The power system 104 can also be electrically coupled to vehicle electronics systems such as audio systems, display systems, navigation systems, temperature control systems, or the like.

The sensor system 106 includes a variety of sensors disposed on, or integrated with, various components of the vehicle 100. In one embodiment, the sensor system 106 is communicatively coupled to the power system and the controller 140 to transfer measurements of the power system 104 to the controller 140. The sensor system 106 may include a current sensor, a voltage sensor, a temperature sensor, or the like.

The propulsion system 120 can include an ICE system 122 and at least one electric motor assembly (e.g., a first electric motor 124 and a second electric motor 126). Each component of the propulsion system 120 can be configured to drive at least one the wheels 130 of the vehicle 100 via a transmission system coupled to a front axle shaft or a rear axle shaft, which are coupled to a respective front and rear set of the wheels 130.

In one embodiment, the controller 140 is configured to analyze outputs of the power system 104 and generate a prediction of an internal short of the power system 104. The controller is discussed in greater detail in FIG. 2. Techniques used to analyze the outputs of the power system 104 are discussed in FIG. 3. Techniques used to generate the prediction of the short are discussed in FIG. 4.

Figure 2:
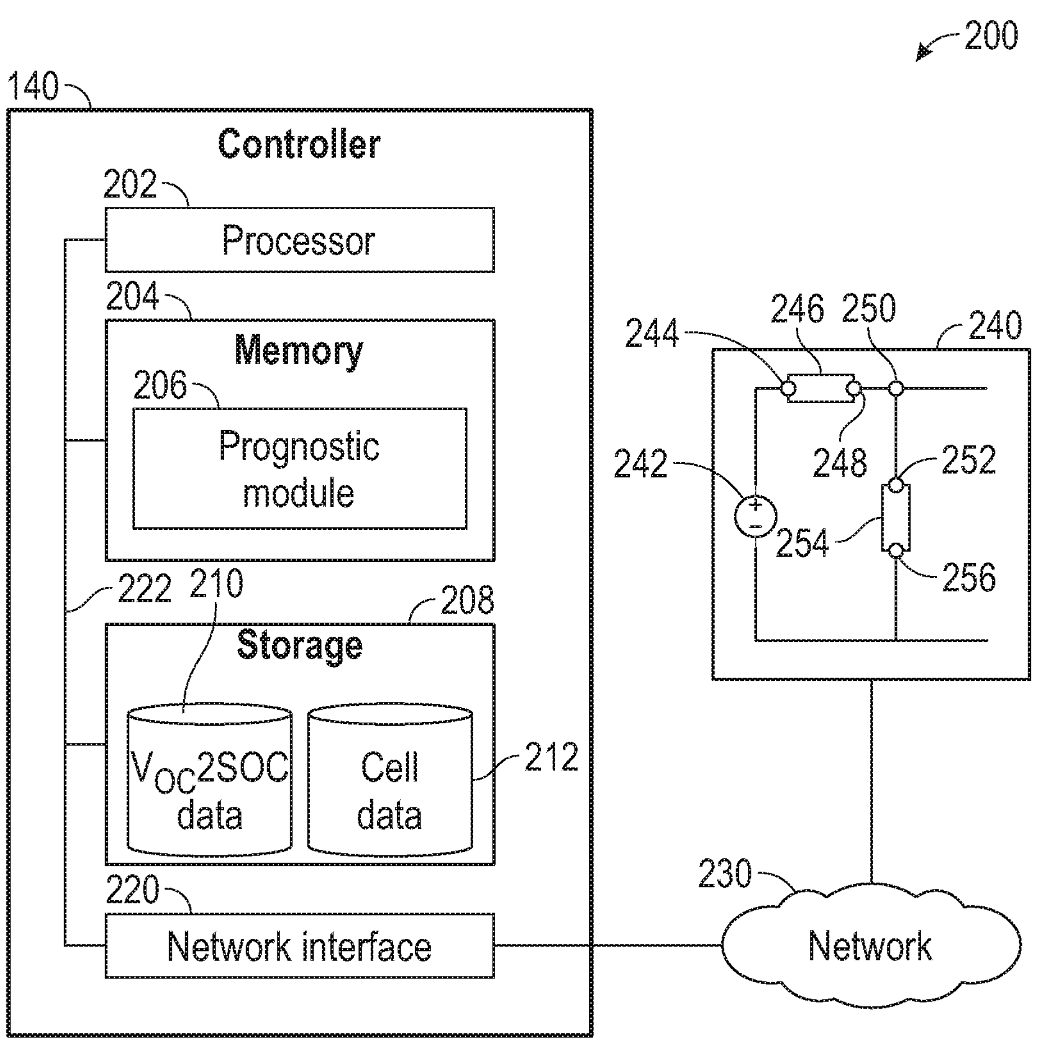
FIG. 2 illustrates a computing environment, according to an embodiment.

FIG. 2 illustrates a computing environment 200, according to an embodiment. In the illustrated embodiment, the computing environment 200 includes a controller 140, a network 230, and a cell 240.

In one embodiment, the controller 140 includes a processor 202 that obtains instructions and data via a bus 222 from a memory 204 or storage 208. Not all components of the controller 140 are shown. The controller 140 is generally under the control of an operating system (OS) suitable to perform or support the functions or processes disclosed herein. The processor 202 is a programmable logic device that performs instruction, logic, and mathematical processing, and may be representative of one or more CPUs. The processor may execute one or more algorithms, instruction sets, or applications in the memory 204 or storage 208 to perform the functions or processes described herein.

The memory 204 and storage 208 can be representative of hard-disk drives, solid state drives, flash memory devices, optical media, and the like. The storage 208 can also include structured storage (e.g., a database). In addition, the memory 204 and storage 208 may be considered to include memory physically located elsewhere. For example, the memory 204 and storage 208 may be physically located on another computer communicatively coupled to the controller 140 via the bus 222 or the network 230.

The controller 140 can be connected to other computers (e.g., controllers, distributed databases, servers, or webhosts) or the cell 240 via a network interface 220 and the network 230. Examples of the network 230 include a controller area network (CAN), a transmission control protocol (TCP) bus, electrical busses, physical transmission cables, optical transmission fibers, wireless transmissions mediums, routers, firewalls, switches, gateway computers, edge servers, a local area network, a wide area network, a wireless network, or the like. The network interface 220 may be any type of network communications device allowing the controller 140 to communicate with computers and other components of the computing environment 200 via the network 230.

In the illustrated embodiment, the memory 204 includes a prognostic module 206. The prognostic module 206 represents one or more algorithms, instruction sets, software applications, or other computer-readable program code that can be executed by the processor 202 to perform the functions, operations, or processes described herein.

In one embodiment, the prognostic module 206 receives feature measurements of the power system 104 from the sensor system 106 coupled to the power system 104. Examples of feature measurements include a voltage, a current, a temperature, a resistance, a pressure, a gas vent value, or the like. The prognostic module 206 can store the feature measurements as cell data 212 in the storage 208.

In the illustrated embodiment, the cell 240 is one of the cells included in the power system 104. The circuit configuration depicted in cell 240 represents one example of a battery cell equivalence circuit model that is common to the cells of the power system 104. In the illustrated embodiment, the cell 240 includes a voltage source 242 connected to a first end 244 of a first internal resistor 246. In one embodiment, the voltage source 242 supplies an open circuit voltage ($V_{OC}$). A second end 248 of the first internal resistor 246 is connected to a measurement point 250, a load (not shown), and a first connection point 252 of a short resistor 254. A second connection point 256 of the short resistor is connected to the voltage source 242 and the load.

The sensor system can use the measurement point 250 as one connection to measure a feature (e.g., a voltage drop, or a resistance) corresponding to the short resistor 254. In one embodiment, a short circuit that develops in the cell 240 decreases the resistance of the short resistor 254. As the resistance of the short resistor 254 approaches 0 ohms, a greater excess of current can flow in the electrical path that includes the short resistor 254.

In one embodiment, the storage 208 includes $V_{OC}$2SOC data 210, such as an open circuit voltage ($V_{OC}$) to state of charge (SOC) table, chart, or graph, that can be used to convert a voltage or current at the measurement point 250 to an SOC value, and the reverse. The prognostic module 206 may use the feature measurements of the cell 240 or the $V_{OC}$2SOC data 210 to determine a health indicator of the power system 104, and predict an internal short based on the health indicator. This process is discussed further in FIGS. 3 and 4.

Figure 3:
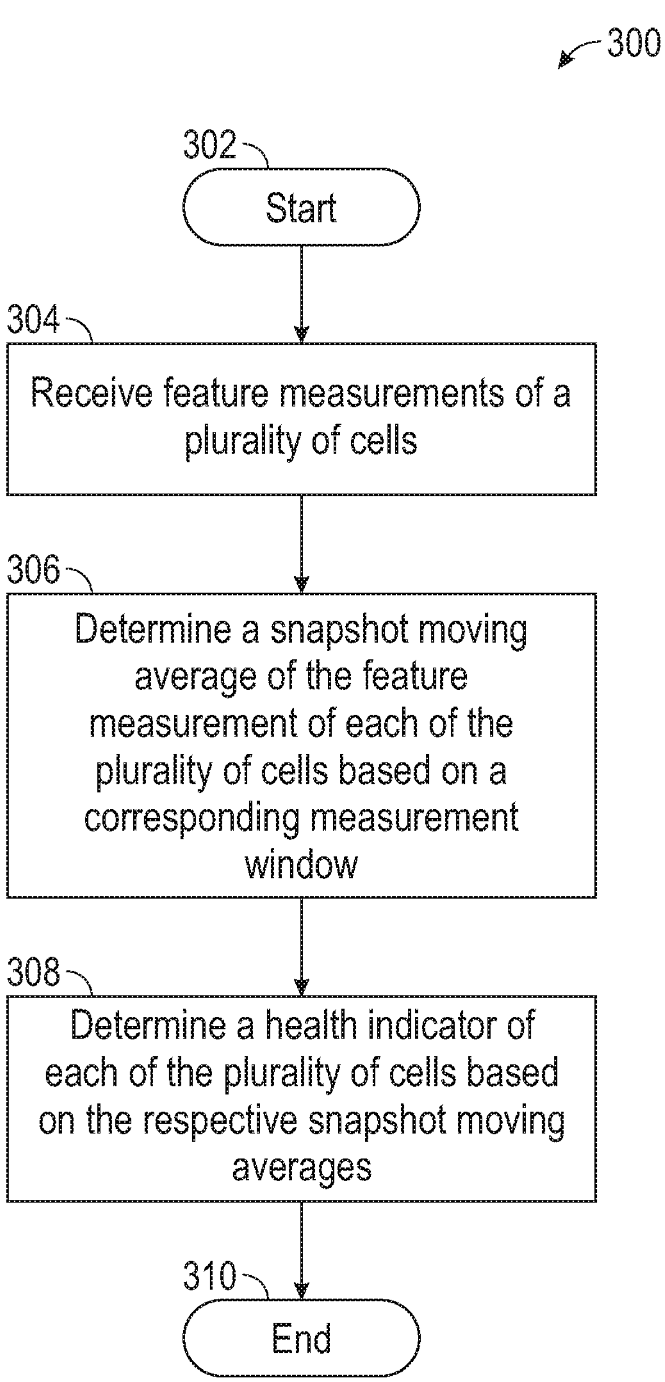
FIG. 3 illustrates a flowchart of a method of determining a health indicator, according to an embodiment.

FIG. 3 illustrates a flowchart of a method 300 of determining a health indicator, according to an embodiment. The method 300 begins at block 302.

At block 304, the prognostic module 206 receives feature measurements of a plurality of cells. As previously discussed, the sensor system 106 can be coupled to the power system 104 to measure the features of the cells of the power system 104. Examples of the feature measurements include: a voltage, a current, a temperature, a pressure, gas vent value, or the like. In one embodiment, the sensor system 106 measures the features at the measurement point 250.

At block 306, the prognostic module 206 determines a snapshot moving average of the feature measurement of each of the plurality of cells based on a corresponding measurement window. In one embodiment, measurements of the sensor system 106 include electrical noise that can affect a measurement output signal at different times. For instance, a voltage signal may have an average measurement of 5 V, but sampling the signal at a first time (e.g., at 0.01 seconds) may yield a measurement of 4.9 V, while sampling the signal at a second time (e.g., at 0.02 seconds) may yield a measurement of 5.1 V.

Therefore, to accurately determine a feature measurement of a cell, the prognostic module 206 can take a moving average of the feature measurement across a snapshot time duration (i.e., a measurement window), which can be centered at periodic time intervals. For example, assuming that the feature measurement is a voltage output of cell 240 (represented as V(i), where i represents an iterative count corresponding to one time interval), and assuming that the time interval is 5 seconds, and assuming that the measurement window size spans 1 second, then after a time lapse of the first 5 seconds of the signal output, the prognostic module 206 would determine V(1) as the moving average of V(i) from 4.5 seconds to 5.5 seconds. At the next time interval, the prognostic module 206 would determine V(2) as the moving average of V(i) from 9.5 seconds to 10.5 seconds, and so on.

In one embodiment, the prognostic module 206 determines the size of the measurement window to apply to the feature measurement based on an expected short resistance of the short resistor 254. As previously discussed, as the resistance of the short resistor 254 approaches 0 ohms, a greater excess of current can flow in the electrical path that includes the short resistor 254. Thus, as the resistance of the short resistor 254 decreases, the prognostic module 206 can use smaller measurement window durations to more quickly identify the presence or development of the short.

In another embodiment, the prognostic module 206 is configured to use predetermined measurement window sizes in accordance with the following calibration guidelines.

| | Short Resistance ($R_S$) | | |
|---|---|---|---|
| | $R_S$ < 10 Ohms | $10 \le R_S <$ 100 Ohms | $100 \le R_S \le$ 1000 Ohms |
| Measurement Window Size Range | 0-200$^-$ seconds | 200$^+$-500$^-$ | 500$^+$-7200 seconds |
| Recommended Measurement Window Size | 10 seconds | 200 seconds | 600 seconds |

In yet another embodiment, the measurement window size remains constant, and the feature measurements covered by the measurement window are entered into a parallel, staggered data buffer. In this manner, as long as the buffers are staggered at time intervals that correspond to measurement window size ranges of an expected short resistance (e.g., 0-200 seconds for $R_S$<10 Ohms), the prognostic module 206 can identify low short resistance values even with large measurement window sizes (e.g., 600 seconds).

At block 308, the prognostic module 206 determines a health indicator of each of the plurality of cells based on the respective snapshot moving averages. Examples of the health indicator include a voltage drop, an estimated internal short resistance, a solid electrolyte interface (SEI) thickness, a state of charge, a cell capacity, a lithium plating index, or the like.

In one embodiment, the prognostic module 206 determines the health indicator as a difference between two snapshot moving averages of consecutive time intervals. For instance, continuing the example at block 306, a voltage drop health indicator may be determined as V(2)–V(1).

In one embodiment, when a state of charge (SOC) of the cell 240 reaches 35%-45%, changes in feature measurements can be difficult to detect. Hence, the prognostic module 206 may determine a difference in the health indicators by first stopping external charging or discharging of the cell 240. Without external charging or discharging, the cell 240 enters into a relaxation period, where chemical reactions, ion migration, polarization effects, and the like, of the cell 240 cause transient effects until the cell 240 reaches equilibrium. During the relaxation period, the prognostic module 206 can use ongoing feature measurements to determine the health indicator. The relaxation time of the cell can also be used as a health indicator to predict a short circuit of the cell 240.

In one embodiment, the prognostic module 206 can determine the health indicator using the $V_{OC}$2SOC data 210. For instance, after determining a snapshot moving average of a feature measurement, the prognostic module 206 can identify the SOC of the cell 240 from a $V_{OC}$2SOC table, chart, or graph using V(1) or V(2) as an index.

In one embodiment, when the power system 104 is subject to cell balancing, the prognostic module 206 determines non-balanced feature measurements to determine the health indicators. The prognostic module 206 can revert balanced feature measurements to non-balanced feature measurements by bypassing a resistance of a balanced cell to remove an impact of current discharge on feature measurements (e.g., a voltage or SOC) of the balanced cell. The prognostic module 206 can then measure, via the sensor system 106, the non-balanced features. Afterwards, the prognostic module 206 can compare the non-balanced features to the cell-balanced features using VOC2SOC conversions.

For instance, after discharging the cell, the prognostic module 206 can determine a balanced SOC of the cell 240 as follows:

$$SOC_B(i) = V_{OC}2SOC(V_B(i) + p), \quad \text{(Eq. 1)}$$

where $SOC_B$(i) represents the balanced SOC of the cell 240 at an $i^{th}$ time interval, $V_{OC}$2SOC represents a conversion function based on the $V_{OC}$2SOC data 210, $V_B$(i) represents a measured cell balanced voltage of cell 240, and p represents a polarization correction (e.g., a voltage drop across the first internal resistor 246).

Afterwards, the prognostic module 206 can use the balanced SOC of the cell 240 to determine the non-balanced SOC as follows:

$$SOC(i) = SOC_B(i) - \Delta SOC_B(i), \quad \text{(Eq. 2)}$$

where SOC(i) represents the non-balance SOC of the cell 240, $SOC_B$(i) is determined in Eq. 1, and Δ $SOC_B$(i) represents a change in the balanced SOC of the cell 240 at an $i^{th}$ time interval. In one embodiment, Δ $SOC_B$(i) can be determined as a measured balanced Amp per hour ("A(i)/hr") of the cell 240 divided by the capacity of the cell 240.

Finally, the prognostic module 206 can use the non-balanced SOC of the cell 240 to determine the non-balanced feature measurement of the cell 240 as follows:

$$V(i) = V_{OC}2SOC(SOC(i)) - p \quad \text{(Eq. 3)}$$

where V(i) represents the non-balanced voltage measurement of the cell 240, SOC(i) is determined in Eq. 2, $V_{OC}$2SOC represents a conversion function based on the $V_{OC}$2SOC data 210, and p represents a polarization correction.

The prognostic module 206 can then use V(i) to determine health indicators as previously described.

Figure 4:
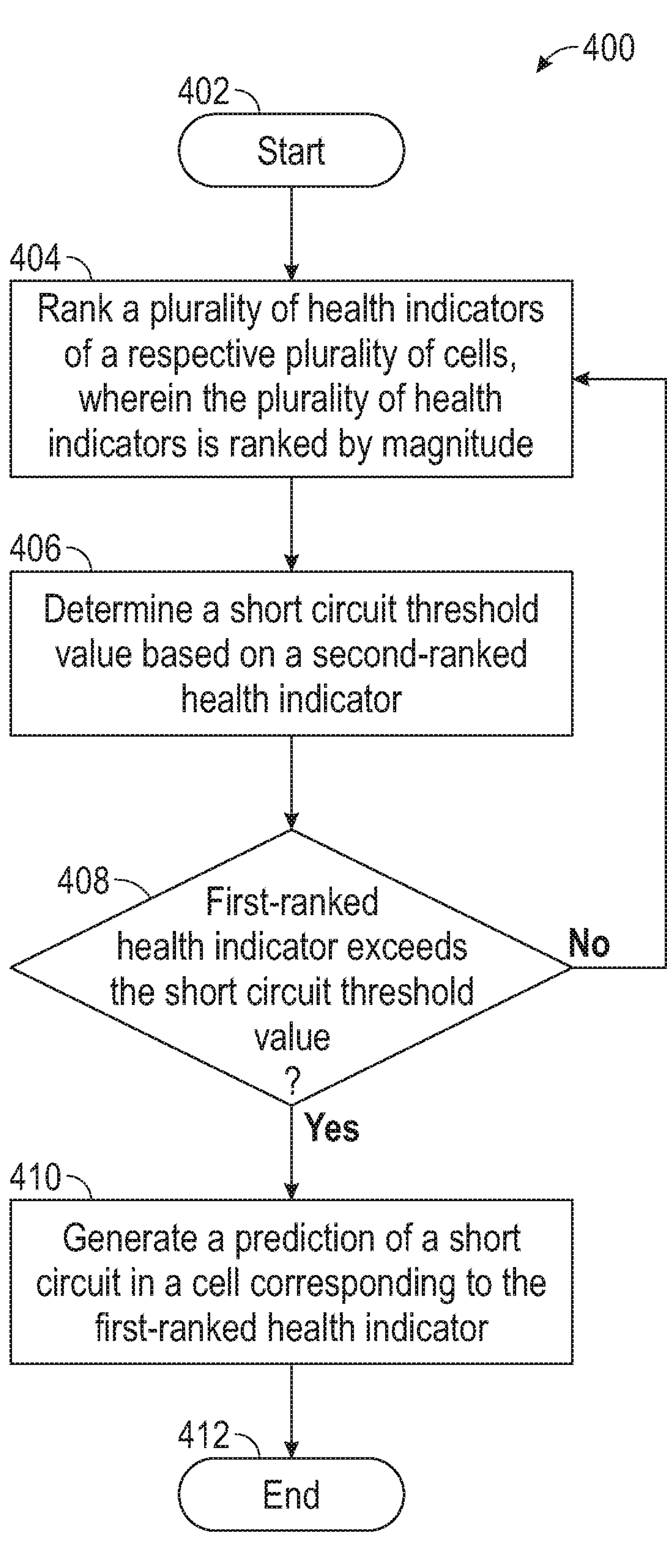
FIG. 4 illustrates a flowchart of a method of predicting an internal short based on a health indicator, according to an embodiment.

In another embodiment, the prognostic module 206 can adjust a short circuit threshold value to account for the cell balanced voltage, as described in FIG. 4. The method 300 ends at block 310.

FIG. 4 illustrates a flowchart of a method 400 of predicting an internal short based on a health indicator, according to an embodiment. The method 400 begins at block 402.

At block 404, the prognostic module 206 ranks a plurality of health indicators of a respective plurality of cells, where the plurality of health indicators is ranked by magnitude. The health indicators may be ranked in ascending or descending order. As previously described, examples of the health indicator include a voltage drop, an estimated internal short resistance, an SEI thickness, a state of charge, a cell capacity, a lithium plating index, or the like.

In one embodiment, an n-ranked indicator represents the health indicator with the $n^{th}$-largest magnitude in the ranking, and corresponds to the $n^{th}$ cell of the plurality of cells. For example, the first-ranked health indicator may represent a largest voltage drop, which corresponds to a first cell; and a second-ranked indicator may represent a second largest voltage drop, which corresponds to a second cell.

At block 406, the prognostic module 206 determines a short circuit threshold value based on a second-ranked health indicator. In one embodiment, the prognostic module 206 assumes that while the first-ranked health indicator may indicate an internal short circuit of the first cell, the second-ranked health indicator indicates an absence of an internal short circuit of the second cell. In another embodiment, the first-ranked and the second-ranked health indicators may simultaneously indicate internal short circuits of the first cell and the second cell, while a third-ranked health indicator indicates an absence of an internal short circuit of a third cell.

In yet another embodiment, the prognostic module 206 can determine whether an n-ranked health indicator deviates from an average of lower-magnitude health indicator magnitudes. When the n-ranked health indicator deviates from this average, the prognostic module 206 determines that the n-ranked health indicator may indicate an internal short of the n-ranked cell, and the lower-magnitude health indicators indicate no internal short of the corresponding cells. In such circumstances, the prognostic module 206 can determine the short circuit threshold value based on the (n+1)-ranked health indicator.

In one embodiment, the prognostic module 206 determines the short circuit threshold value based on empirical evidence shown to minimize false alarms. For example, the short threshold may be set as 1.6*the second-ranked health indicator (or the (n+1)-ranked indicator), which can reduce false positives of short circuit predictions of the cell 240.

As previously discussed, in one embodiment, the prognostic module 206 can adjust a short circuit threshold value to account for instances when the plurality of cells is subject to cell balancing. In such circumstances, the prognostic module 206 may adjust the threshold by reducing the short circuit threshold value by a difference between the non-balanced voltage (V(i)) and a balanced voltage ($V_B(i)$).

At block 408, the prognostic module 206 determines whether a first-ranked health indicator exceeds the short circuit threshold value. Upon determining that the first-rank health indicator does not exceed the short circuit threshold value, the method 400 proceeds to block 404, where it performs as described above. However, upon determining that the first-rank health indicator does exceed the short circuit threshold value, the method 400 proceeds to block 410.

At block 410, the prognostic module 206 generates a prediction of a short circuit in a cell corresponding to the first-ranked health indicator. When the first-ranked health indicator does not exceed the short value threshold, the prognostic module 206 determines that no short circuit is present in the first cell. However, when the first-rank health indicator does exceed the short circuit threshold value, the prognostic module 206 determines that a short circuit is present or developing in the first cell. In one embodiment, the prognostic module 206 can also predict a degraded capacity of the cell 240 when a voltage-based health indicator of the cell 240 is larger than the voltage based health indicators of other cells of the power system 104.

Upon generating the prediction of a short in the first cell, the prognostic module 206 can take action to mitigate the effects of the short circuit, or to prevent the short circuit from developing further. For example, the prognostic module 206 can generate and transmit an alert of the short circuit to a user of the vehicle 100 or a repair facility so that the cell of concern can be repaired or replaced. The prognostic module 206 may also control the operation of the vehicle 100 to mitigate the impact of the short circuit on the cell (e.g., prevent overheating of the cell). The method 400 ends at block 412.

The terms “a” and “an” do not denote a limitation of quantity, but rather denote the presence of at least one of the referenced items. The term “or” means “and/or” unless clearly indicated otherwise by context. Reference throughout the specification to “an aspect”, means that a particular element (e.g., feature, structure, step, or characteristic) described in connection with the aspect is included in at least one aspect described herein, and may or may not be present in other aspects. In addition, it is to be understood that the described elements may be combined in any suitable manner in the various aspects.

When an element such as a layer, film, region, or substrate is referred to as being “on” another element, it can be directly on the other element or intervening elements may also be present. In contrast, when an element is referred to as being “directly on” another element, there are no intervening elements present.

Unless specified to the contrary herein, all test standards are the most recent standard in effect as of the filing date of this application, or, if priority is claimed, the filing date of the earliest priority application in which the test standard appears.

Unless defined otherwise, technical and scientific terms used herein have the same meaning as is commonly understood by one of skill in the art to which this disclosure belongs.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A method for predicting a circuit condition of a power system of a vehicle, comprising:

receiving feature measurements of a plurality of cells of the power system;

determining a snapshot moving average of a feature measurement of each of the plurality of cells based on a corresponding measurement window;

determining a health indicator of each of the plurality of cells based on the respective snapshot moving averages;

ranking a plurality of health indicators of a respective plurality of cells, wherein the plurality of health indicators is ranked by magnitude;

determining a short circuit threshold value based on a second-ranked health indicator;

upon determining that a first-ranked health indicator exceeds the short circuit threshold value, generating a prediction of a short circuit in a cell corresponding to the first-ranked health indicator; and controlling an operation of the vehicle to mitigate an impact of the short circuit in the cell corresponding to the first-ranked health indicator by preventing overheating of the cell corresponding to the first-ranked health indicator.

2. The method of claim 1, wherein the feature measurements include a voltage, a current, a temperature, a pressure measurement, or a gas vent value; and wherein the plurality of health indicators include a voltage drop, an estimated internal short resistance, a solid electrolyte interface thickness, a state of charge, a cell capacity, or a lithium plating index.

3. The method of claim 1, wherein a size of the measurement window is based on an expected short resistance of the plurality of cells.

4. The method of claim 1, wherein a size of the measurement window is constant, wherein data of the measurement window is entered into a parallel staggered data buffer, and wherein the data buffer is processed at intervals based on an expected short resistance of the plurality of cells.

5. The method of claim 1, wherein the feature measurements are determined during a relaxation period of the plurality of cells.

6. The method of claim 1, wherein the feature measurements are determined from cell-balanced cells, and wherein the feature measurements are reverted to non-cell balanced values via voltage to state of charge conversions.

7. The method of claim 1, wherein the plurality of health indicators is ranked in ascending or descending order, wherein the first-ranked health indicator indicates a potential short of a cell corresponding to the first-ranked health indicator, and wherein the second-ranked health indicator indicates an absence of a short of a cell corresponding to the second-ranked health indicator.

8. A system for predicting a circuit condition of a power system of a vehicle, comprising:

- a processor; and
- memory or storage comprising an algorithm or computer instructions, which when executed by the processor, performs an operation comprising:
  - receiving feature measurements of a plurality of cells of the power system;
  - determining a snapshot moving average of a feature measurement of each of the plurality of cells based on a corresponding measurement window;
  - determining a health indicator of each of the plurality of cells based on a respective snapshot moving averages;
  - ranking a plurality of health indicators of the respective plurality of cells, wherein the plurality of health indicators is ranked by magnitude;
  - determining a short circuit threshold value based on a second-ranked health indicator;
  - upon determining that a first-ranked health indicator exceeds the short circuit threshold value, generating a prediction of a short circuit in a cell corresponding to the first-ranked health indicator; and
  - controlling an operation of the vehicle to mitigate an impact of the short circuit in the cell corresponding to the first-ranked health indicator by preventing overheating of the cell corresponding to the first-ranked health indicator and transmitting an alert to a repair facility identifying the cell corresponding to the first-ranked health indicator as needing one of repair and replacement.

9. The system of claim 8, wherein the feature measurements include a voltage, a current, a temperature, a pressure measurement, or a gas vent value; and wherein the plurality of health indicators include a voltage drop, an estimated internal short resistance, a solid electrolyte interface thickness, a state of charge, a cell capacity, or a lithium plating index.

10. The system of claim 8, wherein a size of the measurement window is based on an expected short resistance of the plurality of cells.

11. The system of claim 8, wherein a size of the measurement window is constant, wherein data of the measurement window is entered into a parallel staggered data buffer, and wherein the data buffer is processed at intervals based on an expected short resistance of the plurality of cells.

12. The system of claim 8, wherein the feature measurements are determined during a relaxation period of the plurality of cells.

13. The system of claim 8, wherein the feature measurements are determined from cell-balanced cells, and wherein the feature measurements are reverted to non-cell balanced values via voltage to state of charge conversions.

14. The system of claim 8, wherein the plurality of health indicators is ranked in ascending or descending order, wherein the first-ranked health indicator indicates a potential short of a cell corresponding to the first-ranked health indicator, and wherein the second-ranked health indicator indicates an absence of a short of a cell corresponding to the second-ranked health indicator.

15. A non-transitory computer-readable storage medium having a computer-readable program code embodied therewith for predicting a circuit condition of a power system of a vehicle, the computer-readable program code executable by one or more computer processors to perform an operation comprising:

- receiving feature measurements of a plurality of cells of the power system;
- determining a snapshot moving average of a feature measurement of each of the plurality of cells based on a corresponding measurement window;
- determining a health indicator of each of the plurality of cells based on the respective snapshot moving averages;
- ranking a plurality of health indicators of a respective plurality of cells, wherein the plurality of health indicators is ranked by magnitude;
- determining a short circuit threshold value based on a second-ranked health indicator;
- upon determining that a first-ranked health indicator exceeds the short circuit threshold value, generating a prediction of a short circuit in a cell corresponding to the first-ranked health indicator;
- controlling an operation of the vehicle to mitigate an impact of the short circuit in the cell corresponding to the first-ranked health indicator by preventing overheating of the cell corresponding to the first-ranked health indicator and transmitting an alert to a repair facility identifying the cell corresponding to the first-ranked health indicator as needing one of repair and replacement; and
- reiterating the operation continuously as the vehicle is operated and continuously adjusting the operation of the vehicle to mitigate the impact of the short circuit in the cell corresponding to the first-ranked health indicator.

16. The non-transitory computer-readable storage medium of claim 15, wherein the feature measurements include a voltage, a current, a temperature, a pressure measurement, or a gas vent value; and wherein the plurality of health indicators include a voltage drop, an estimated internal short resistance, a solid electrolyte interface thickness, a state of charge, a cell capacity, or a lithium plating index.

17. The non-transitory computer-readable storage medium of claim 15, wherein a size of the measurement window is based on an expected short resistance of the plurality of cells.

18. The non-transitory computer-readable storage medium of claim 15, wherein a size of the measurement window is constant, wherein data of the measurement window is entered into a parallel staggered data buffer, and wherein the data buffer is processed at intervals based on an expected short resistance of the plurality of cells.

19. The non-transitory computer-readable storage medium of claim 15, wherein the feature measurements are determined from cell-balanced cells, and wherein the feature measurements are reverted to non-cell balanced values via voltage to state of charge conversions.

20. The non-transitory computer-readable storage medium of claim 15, wherein the plurality of health indicators is ranked in ascending or descending order, wherein the first-ranked health indicator indicates a potential short of a cell corresponding to the first-ranked health indicator, and wherein the second-ranked health indicator indicates an absence of a short of a cell corresponding to the second-ranked health indicator.

* * * * *